United States Patent [19]
Kalkstein

[11] Patent Number: 6,121,903
[45] Date of Patent: Sep. 19, 2000

[54] ON-THE-FLY DATA RE-COMPRESSION

[75] Inventor: Nir Kalkstein, Herzliya, Israel

[73] Assignee: Infit Communications Ltd., Tel Aviv, Israel

[21] Appl. No.: 09/218,953

[22] Filed: Dec. 22, 1998

Related U.S. Application Data

[63] Continuation-in-part of application No. 09/013,980, Jan. 27, 1998.

[51] Int. Cl.[7] .................................................. H03M 7/40
[52] U.S. Cl. ............................ 341/63; 341/65; 341/106
[58] Field of Search ............................... 341/61, 63, 50, 341/51, 87, 106, 65

[56] References Cited

U.S. PATENT DOCUMENTS

| | | |
|---|---|---|
| 4,701,745 | 10/1987 | Waterworth . |
| 5,016,009 | 5/1991 | Whiting et al. . |
| 5,126,739 | 6/1992 | Whiting et al. . |
| 5,532,694 | 7/1996 | Mayers et al. ............................. 341/67 |
| 5,841,376 | 11/1998 | Hayashi ................................... 341/51 |
| 5,945,933 | 8/1999 | Kalkstein .................................. 341/63 |

OTHER PUBLICATIONS

Ziv J. Lempel "A: A universal algorithm for sequential data compression", IEEE Transactions on Information Theory, vol. IT–23, (1977) pp. 337–343.

Brent R.P.: A linear algorithm for data compression, The Australian Journal, vol. 19, (1987) pp. 64–68.

Ziv J. Lempel "A: Compression of individual sequences via variable rate coding, IEEE Transactions on Information Theory", vol. IT–24, (1978) pp. 530–536.

William R.N., "An extremely fast Ziv–Lempel data compression algorithm", Proceedings Data Compression Conference DCC'91, Snowbird, Utah , Apr. 8–11, 1991,IEEE Computer Society Press, Los Alamitos , CA, pp. 362–371.

Huffman D.: A method for the construction of minimum redundancy codes, Proceedings IRE, vol. 40, (1952) pp. 1098–1101.

H.S. Heaps,"Information retrieval: Computational and theoretical aspects", Academic Press, New York (1978).

Shell D.L., "A High Speed Storing Procedure, Communications of the ACM", vol. 2, (1959) pp. 30–32.

Cormen T.H. , Leiserson C.E. , Rivest R.L. , "Introduction to Algorithms", The MIT Press, Cambridge, MA (1990), ch. 17.

*Primary Examiner*—Brian Young
*Attorney, Agent, or Firm*—Mark M. Friedman

[57] ABSTRACT

Previously compressed data is re-compressed with a better algorithm. A data analyzer analyses the compressed data to determine whether the data has been compressed with a supported compression format such as GIF, JPG or PNG. A data decompressor decompresses the data, then a data compressor re-compresses the data using the superior compression algorithm. When the data is to be reused, a data decompressor decompresses the data and a data compressor recompresses the data using the original compression algorithm. The invention may be implemented over a path in a data network. Compressed data that is to be sent over path is intercepted and re-compressed with the superior algorithm before being sent over the path. On the other end of the path, the data is converted back to its original compression format.

18 Claims, 10 Drawing Sheets

ON-THE-FLY DATA RE-COMPRESSION

CROSS-REFERENCE TO RELATED APPLICATIONS

This application is a continuation-in-part of application Ser. No. 09/013,980, filed Jan. 27, 1998, entitled "ADAPTIVE PACKET COMPRESSION APPARATUS AND METHOD."

FIELD OF THE INVENTION

The present invention relates to data compression and, more specifically, to improving the degree of compression for previously compressed files.

BACKGROUND OF THE INVENTION

Data compression algorithms convert data defined in a given format to another format so that the resulting format contains fewer data bits (i.e., the ones and zeros that define digital data) than the original format. Hence, the data is compressed into a smaller representation. When the original data is needed, the compressed data is decompressed using an algorithm that is complementary to the compression algorithm.

Data compression techniques are used in a variety of data processing and data networking applications. Personal computer operating systems use data compression techniques to reduce the size of data files stored in the hard disk drives of the computer. This enables the operating system to store more files on a given disk drive. Data networking equipment use data compression techniques to reduce the amount of data sent over a data network. For example, when a web browser retrieves a file from a web server, the file may be sent over the Internet in a compressed format. This reduces the transmission time for sending the file and reduces the usage of the network, thereby reducing the cost of transmission.

The performance of data compression techniques is mainly determined by three major factors. The first factor is the amount of compression achieved, or the ratio of the number of starting data bits to the number of bits produced. The second factor is the speed of compression, or the time needed to produce these bits. The third factor is the amount of computational overhead, in particular the requirement for computer resources such as memory. Generally, the following relation holds among these factors: the more compression achieved, the slower is the process and the more overhead required; conversely, the faster the process, the lesser compression amount achieved.

Normally, a particular compression technique is chosen according to the characteristics of the application. For example, "off-line" applications, which are not performed in real time, typically give up speed and overhead to achieve better compression. On the other hand, "on-line" applications, and in particular communication applications, typically settle for lesser compression to gain more speed.

Packet-based communication networks (such as the Internet) transfer information between computers and other equipment using a data transmission format known as packetized data. The stream of data from a data source (e.g., a host computer) is divided into variable or fixed length "chunks" of data (i.e., packets). Routers in the network route the packets from the source to the appropriate data destination. In many cases, the packets may be relayed through several routers before they reach their destination. Once the packets reach their destination, they are reassembled to regenerate the stream of data.

Conventional packet-based networks use a variety of protocols to control data transfer throughout a network. For example, the Internet Protocol ("IP") defines procedures for routing data through a network. To this end, IP specifies that the data is organized into frames each of which includes an IP header and the associated data. The routers in the network use the information in the IP header to forward the packet through the network. In the IP vernacular, each router-to-router (or switch-to-router, etc.) link is referred to as a hop.

Communication applications, or programs which facilitate the transmission of data on a communication channel, have certain characteristics which should be considered when choosing a technique for compression. If compression is desired, each packet should be compressed before transmission by the selected compression technique. Since communication channels between computers, particularly networks employing telephone system connections, have limited capacity, greater compression of the data increases the total amount of information which can be transmitted on the available bandwidth. On the other hand, since data compression for communication systems is typically needed on-line, the need for greater compression must be balanced against the increased amount of time and resources required for the compression process as the amount of compression increases. These competing requirements can be balanced by the choice of the proper data compression technique.

In general, data compression techniques encode the original data according to a translation data dictionary referred to herein as the "encoding table". An encoding table contains a series of mappings between the original data and the compressed representations of the actual data. For example, the letter "A" may be represented by the binary string "010." The encoding table is typically derived from the data according to a selected scheme relating to various statistical information gathered therefrom, such as the frequencies of certain patterns in the data. Normally, the length of the bit representation in the encoding table for encoded data patterns is inversely related to the frequency of occurrence of these patterns.

Hereinafter, the term "text" refers to a stream of data bits which is provided as a unit to the compression algorithm, and includes but is not limited to, word data from a document, image data and other types of data. As noted above, the text can have features or characteristics such as internal patterns of data. The text can be compressed according to a number of different types of compression algorithms.

Hereinafter, the term "static compression algorithm" refers to algorithms which do not affect, update or otherwise change the encoding table for a given unit of text. Hereinafter, the term "dynamic compression algorithm" refers to algorithms for which the encoding table is constantly updated or changed according to features or characteristics of the text by a selected scheme. Hereinafter, the term "semi static compression algorithm" refers to algorithms for which the encoding table is occasionally updated or changed according to the text by a selected scheme. Hereinafter, the term "adaptive compression algorithm" refers to a dynamic or semi-static algorithm in which the encoding table is either constantly or occasionally updated or changed according to data pattern variations encountered in the text.

The last class of algorithms, adaptive algorithms, has a number of advantages. For example, these algorithms permit the encoding table to be adjusted to best reflect the data patterns in the text which is a "learning" capability.

Furthermore, the encoding table need not necessarily be transmitted along with the encoded data, but rather can be fully rebuilt at the receiving end from the encoded data during decompression. Thus, this class of techniques is particularly well suited for data compression in a communication system.

Examples of such adaptive data compression techniques include the well-known Lempel-Ziv algorithms known, respectively, as LZ77 and LZ78, for constructing the encoding table (Ziv J., Lempel A.: A universal algorithm for sequential data compression, IEEE Transactions on Information Theory, Vol IT-23, (1977) pp. 337–343; Ziv J., Lempel A.: Compression of individual sequences via variable rate coding, IEEE Transactions on Information Theory, Vol IT-24, (1978) pp. 530–536). Waterworth (Waterworth J. R.: Data compression system, U.S. Pat. No. 4,701,745, Oct. 20, 1987) and Whiting et al.(Whiting D. L, George G. A., Ivey G. E.: Data compression apparatus and method, U.S. Pat. No. 5,016,009, May 14, 1991; Whiting D. L., George G. A., Ivey G. E.: Data compression apparatus and method, U.S. Pat. No. 5,126,739, Jun. 30, 1992) provide efficient implementations of the Lempel & Ziv LZ77 technique for identifying data patterns in the text. A similar fast implementation is given by Williams (Williams R. N., An extremely fast Ziv-Lempel data compression algorithm, Proceedings Data Compression Conference DCC'91, Snowbird, Utah, Apr. 8–11, 1991, IEEE Computer Society Press, Los Alamitos, Calif., pp. 362–371). In addition, Huffman (Huffman D.: A method for the construction of minimum redundancy codes, Proceedings IRE, Vol 40, (1952) pp. 1098–1101) provides an optimal encoding scheme. Finally, Brent (Brent R. P.: A linear algorithm for data compression, The Australian Computer Journal, Vol 19, (1987) pp. 64–68) provides a static technique that takes advantage of both LZ77 and the Huffman encoding scheme.

Although these well-known data compression techniques have been successfully employed, they have a number of disadvantages for communication systems. For example, the implementations of Whiting do not use statistical information from previous data packets to more efficiently compress current packets. Furthermore, the static technique of Brent requires the encoding table to be transmitted with the encoded data, thereby consuming valuable bandwidth. Some other methods of compression do not take advantage of the basic structure of data transmissions in communication systems, in which data are transmitted in packets rather than as a continuous stream. Thus, many of the currently available data compression techniques have significant disadvantages, particularly with regard to communication systems. Consequently, a need exists for an improved data compression scheme for data transmission applications.

SUMMARY OF THE INVENTION

Compressed data sent over a path in a communication network is compressed with a better algorithm before being sent over the path. On the other end of the path, the data is converted back to its original compression format.

In one embodiment, at the compression end of the path, a data compressor analyses the data to be sent over the path to determine whether the data is associated with GIF, JPG or PNG files. The data compressor decompresses the data then recompresses it using a better compression algorithm.

At the decompression end of the path, a data decompressor analyses the data received from the path to determine whether the data has been compressed with the better algorithm. If so, the data compressor decompresses that data then recompresses it using the original compression algorithm.

In one embodiment, the invention is implemented in a pair of devices installed on each end of an IP hop. For example, the devices may be installed between a pair of routers. The device on the sending end of the hop intercepts each packet that the router sends over the hop and determines whether that packet should be recompressed using the better algorithm.

The device on the other end of the hop also intercepts each incoming packet. The device then determines whether that packet was recompressed using the better algorithm. If so, the packet is decompressed using a decompression algorithm that corresponds to the better compression algorithm. In addition, if necessary, the device determines the original compression type for the data and compresses the data using the original form of compression.

In another embodiment, the method of the invention is implemented by installing appropriate software modules in the equipment (e.g., router) on the ends of the path. The equipment is configured so that packets are processed as above and stored in the internal memory of the equipment, as necessary.

In one embodiment, the better compression algorithm takes the following form: The compression portion of the process includes the steps of: (a) receiving one of the plurality of data packets designated as packet Pm; (b) parsing the packet Pm, such that the sequence of data elements of the packet Pm is parsed into a sequence of parsed elements, each of the parsed elements having a form selected from the group consisting of a character, a pair of offset and length components, and a run length encoding consisting of a repetition factor component and a character component, and each of parsed elements and each of the components of the parsed elements having a frequency of occurrence; (c) selecting an encoding table from a historical array, the historical array including at least one encoding table from compression of at least one previously compressed data packet, the encoding table having been constructed according to the frequencies of occurrence of a plurality of parsed elements of the at least one previously compressed data packet, independent of data from the packet Pm; (d) encoding the sequence of parsed elements according to the encoding table to form encoded data; (e) packaging the encoded data into the compressed packet; (f) constructing a historical frequency list of the frequencies of occurrence of the parsed elements; (g) constructing an additional encoding table according to the frequencies of occurrence of the parsed elements; and (h) storing the additional encoding table in the historical array.

Preferably, the packet Pm is a first packet of the plurality of data packets and the encoding table in the historical array is constructed according to a preselected distribution. Also preferably, the encoding table includes a Huffman tree.

The encoding table may include a pair of Huffman trees, a first Huffman tree being constructed according to the frequencies of occurrence of: (a) the parsed elements having the form of the character; (b) the repetition factor component and the character component of the parsed elements having the form of the run length encoding; and (c) the length component of the parsed elements having the form of the pair of offset and length components; and a second Huffman tree being constructed according to the frequencies of occurrence of the offset component of the parsed elements having the form of the pair of offset and length components. More preferably, the step of encoding includes encoding each of the parsed elements according to the first Huffman tree if the parsed element has the form of the character or the run-length encoding, and alternatively, if the parsed element has the form of the pair of offset and length components, encoding the length component according to the first Huffman tree and the offset component according to the second Huffman tree.

According to another embodiment of the algorithm, the plurality of parsed elements are divided into a plurality of segments, each of the segments being encoded according to an encoding table from the historical array. More preferably, the method further comprises the step of: (I) arranging the elements of the list according to an arranging scheme, such that the historical frequency list is a ranked frequency list. Also more preferably, the arranging scheme is a sorting scheme. Also more preferably, the arranging scheme is a partial sorting scheme.

According to other embodiments of the present invention, the encoded data is a compressed packet Cm, the method further comprising the step of decoding the compressed packet Cm according to the encoding table.

Preferably, the method further comprises the step of decoding the compressed packet Cm according to the portion of the historical array, the portion being selected according to the designation. Preferably, the step (b) of parsing the packet Pm is performed according to a greedy scheme. Also preferably, the step (b) of parsing the packet Pm is performed according to a look-ahead scheme.

The decompression process of this embodiment includes the steps of: (a) receiving one of the plurality of compressed packets designated as packet Cm; (b) decoding the packet Cm according to an encoding table selected from an historical array including at least one encoding table from a previously decoded data packet to produce a sequence of parsed data elements, each of the parsed data elements having a form selected from the group consisting of a character, a pair of offset and length components, and a run length encoding and each of the parsed data elements having a frequency of occurrence; (c) converting the sequence of parsed data elements into the text string; (d) constructing a historical frequency list of the frequencies of occurrence of the parsed data elements; (e) constructing an additional encoding table according to the frequencies of the parsed data elements; and (f) storing the additional encoding table in the historical array. Preferably, the step of constructing the historical frequency list includes determining a weight of the frequencies of occurrence of the parsed data elements.

According to yet another embodiment of the compression algorithm, there is provided a method for compressing a sequence of a plurality of data packets P1,P2,P3 . . . , each consisting of an arbitrary number of text characters, into a sequence of corresponding compressed data packets C1,C2, C3 . . . , the method comprising the steps of: (a) receiving a current packet Pm of the sequence; (b) storing in a text history window a selected number of text characters of at least one most recently received input packet, including at least text characters forming the current packet Pm; (c) parsing the current packet Pm in accordance with a scheme derived from the LZ77 technique and operating on the text history window, thereby converting the current packet Pm into a sequence of at least one segment, each segment comprising a sequence of one or more parsed data items each having a form selected from the group consisting of a Character, an (Offset, Length) pair, and a run length encoding, the (Offset, Length) pair having an offset component and a length component, and the run length encoding having a repetition factor component and a character component, each of the data items and the components of the data items having an occurrence frequency relating to the number of times the parsed data item or the component of the parsed data item occurs in the sequence of parsed data items constructed for the current packet Pm; (d) substituting the parsed data items of each of the segments by encoded bit strings being extracted from a selected encoding table, the selected encoding table being selected from an array of historical encoding tables, the array including one or more encoding tables generated for selected previous packets, or, for the first packet, including at least one encoding table based on some predetermined distribution of the data items, the encoded bit strings being accompanied by an indicator designating the selected encoding table, thereby encoding the current packet Pm into a compressed packet Cm according to encoding tables generated on the basis of data that is independent of the current packet Pm; (e) providing an output including the compressed packet Cm; (f) updating a historical frequency list, using a representation of the occurrence frequencies of selected parsed data items in selected already processed packets including the current packet Pm, in preparation for processing subsequent packets; (g) generating a ranked historical frequency list by arranging the historical frequency list according to a selected arranging scheme; (h) generating an encoding table using the ranked historical frequency list in accordance with a scheme identical to or derived from the Huffman encoding technique; and (I) incorporating the generated encoding table in the array of historical encoding tables.

Preferably, each of the representations of the occurrence frequencies is derived from a selected function of at least the occurrence frequency of the selected parsed data item. Also preferably, the selected arranging scheme includes a sorting scheme. Also preferably, the selected arranging scheme includes a partial sorting scheme. Preferably, the parsing scheme includes a greedy parsing method. Alternatively and preferably, the parsing scheme includes a look-ahead parsing method.

This compression/decompression algorithm may provide improved compression over conventional techniques in several ways. First, in contrast to dynamic techniques which constantly update the encoding table, the semi-static technique provided by the this embodiment of the compression algorithm only occasionally updates the encoding table, thereby significantly improving the encoding speed. Second, this embodiment features an improved implementation of the Huffman encoding, thereby gaining a significant increase of speed in exchange for slight or negligible degradation of the compression capacity. Third, this embodiment features an improved encoding scheme which provides for achieving better compression.

BRIEF DESCRIPTION OF THE DRAWINGS

These and other features of the invention will become apparent from the following description and claims, when taken with the accompanying drawings, wherein similar references characters refer to similar elements throughout and in which:

DESCRIPTION OF EXEMPLARY EMBODIMENTS

Figure 1:
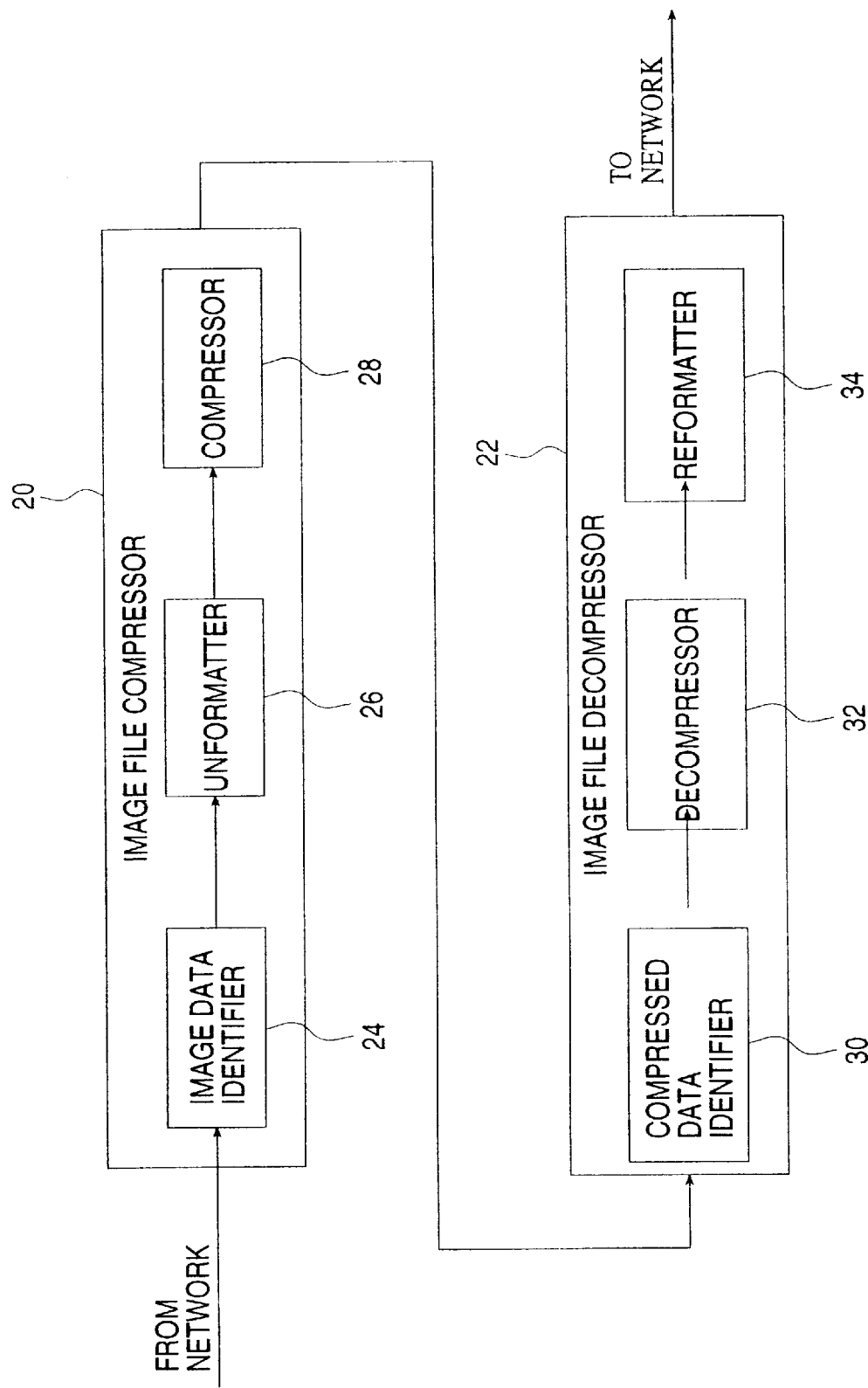
FIG. 1 is a block diagram of one embodiment of a data network incorporating a compression system in accordance with the invention.

FIG. 1 illustrates a path in a data network system employing one embodiment of the invention. For example, the path may consist of an IP hop in a data network. A router (not shown) at one end of the path sends packets to another router (not shown) on the other end of the hop. Some of the packets sent over the hop may be associated with compressed GIF, JPG or PNG image files. In accordance with the invention, an image file compressor 20 recompresses these types of packets to improve the compression of the packets. On the other end of the path, an image file decompressor 22 decompresses and reformat the packets to their original compression format.

In practice, the link between the routers may be either a permanent or temporary link. It is used to transfer unmodified layer 3 protocol packets. Layer 3 is a network layer protocol and encompasses, for example, the Internet Protocol ("IP") and those that conform to the OSI ("Open System Interconnection") reference model.

An image data identifier 24 in the image file compressor 20 analyzes an inbound packet to determine whether its data is part of a GIF, JPG or PNG file that is being sent through the network. If so, the packet is sent to an unformatter 26 that decompresses the packet using the appropriate decompression algorithm. The decompressed data is then sent to a compressor 28. The compressor 28 recompresses the decompressed data using an algorithm that provides better compression than the original compression format.

The operations on the other end of the path are complementary. A compressed data identifier 30 analyzes an inbound packet to determine whether the packet has been recompressed by the image file compressor 20. If so, the packet is sent to a decompressor 32 that decompresses the packet. To ensure accurate decompression, the compressor 28 and the decompressor 32 maintain the same state information (compression history) for the packets. A reformatter 34 then compresses the decompressed data back to its original format (e.g., GIF, JPG or PNG). After the packet is recompressed, the image file decompressor 22 forwards the packet, now back in its original form, to its destination.

Figure 2:
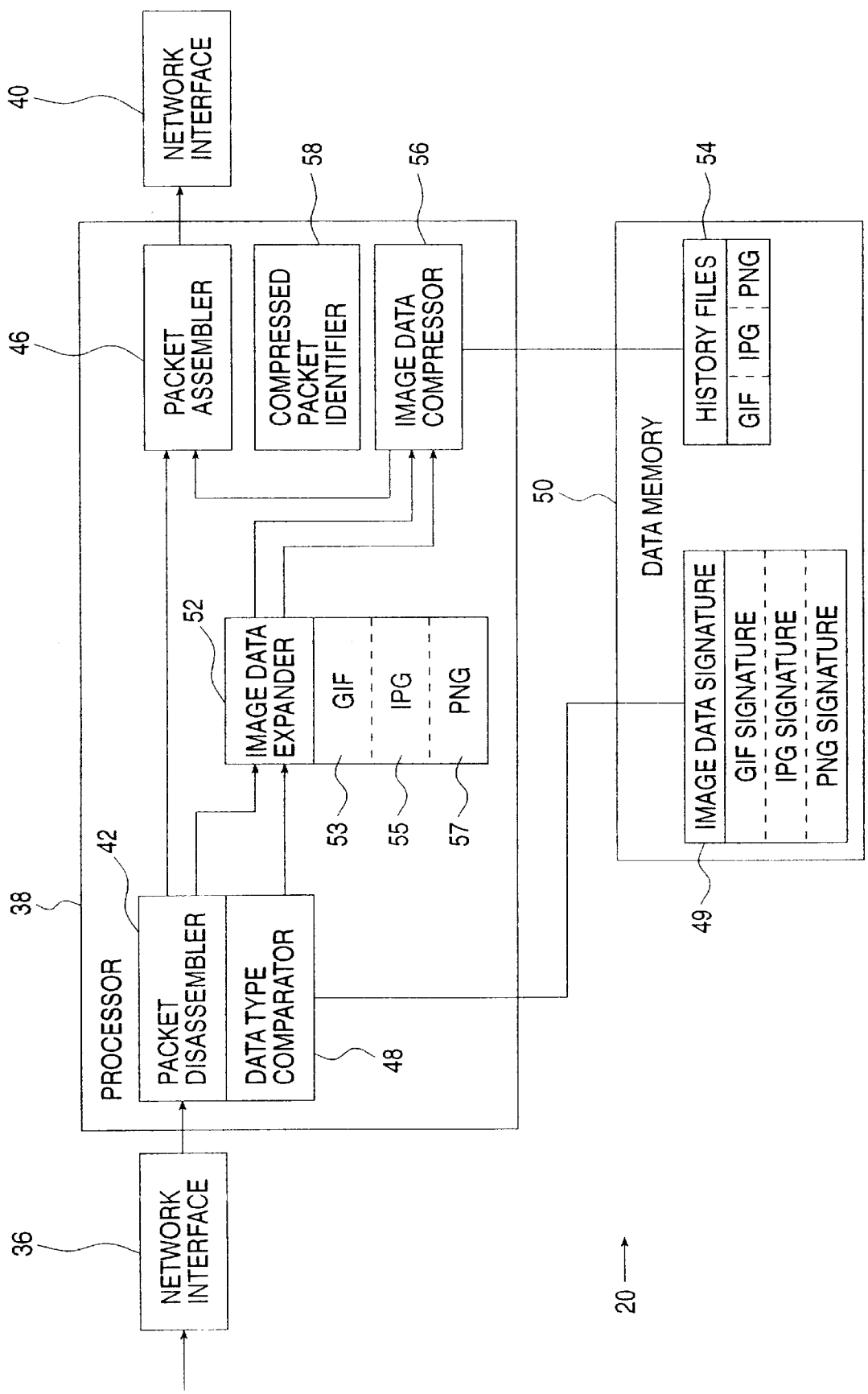
FIG. 2 is a block diagram of a compressor constructed according to the invention.
Figure 3:
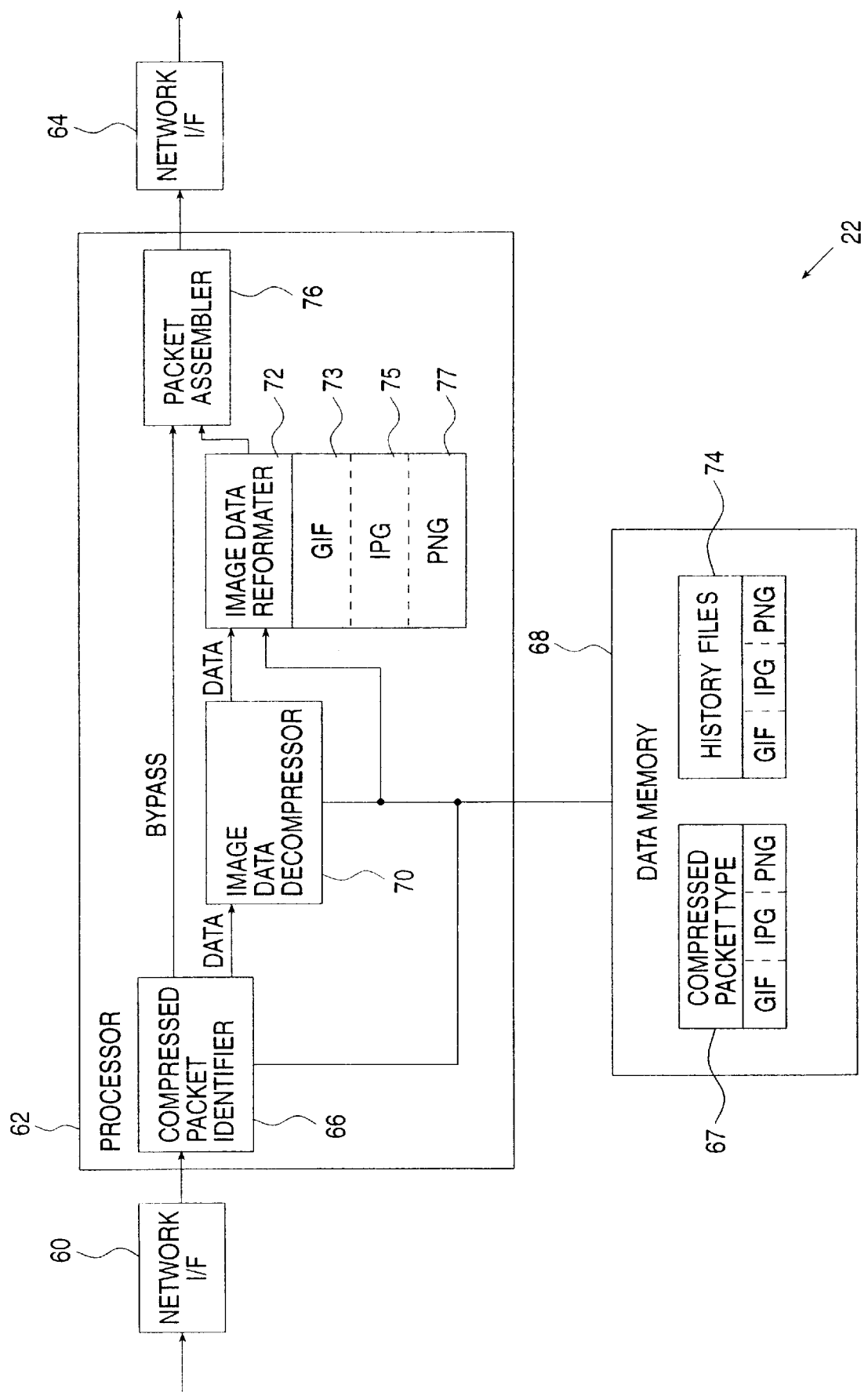
FIG. 3 is a block diagram of a decompressor constructed according to the invention.
Figure 4:
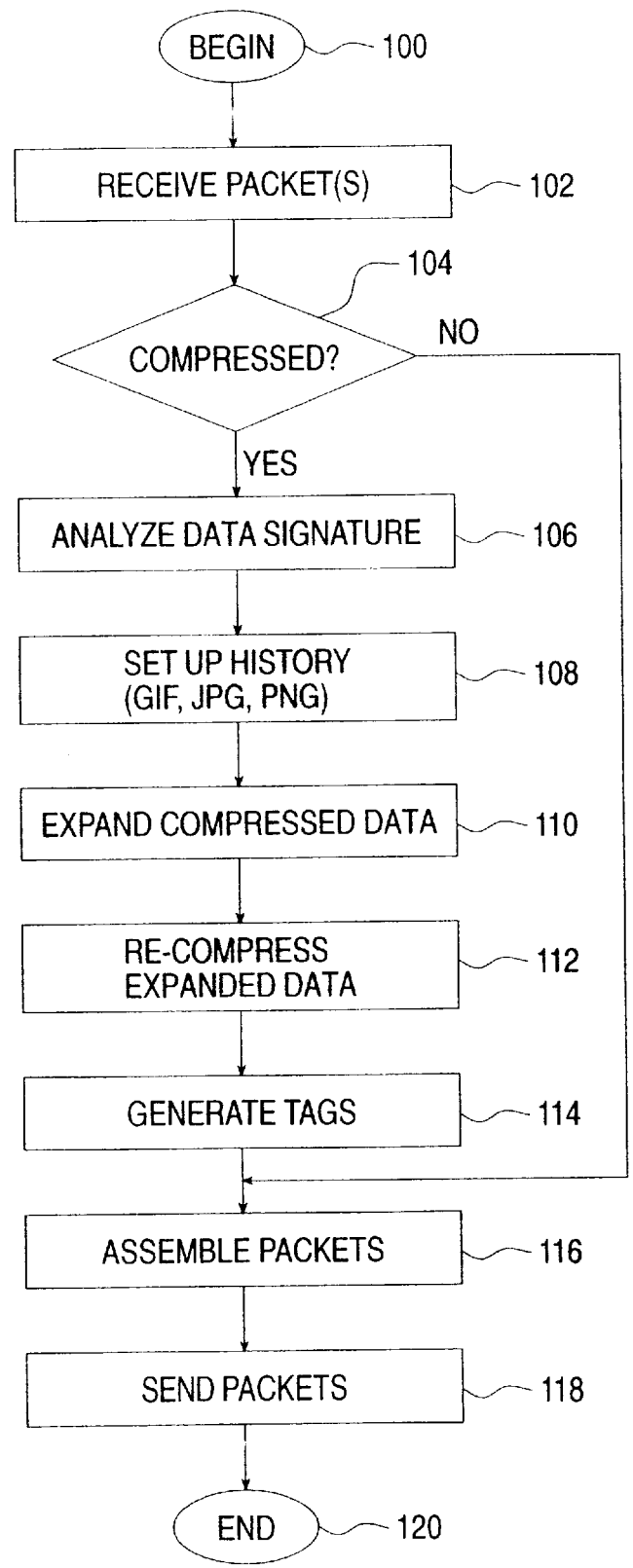
FIG. 4 is a flowchart of operations that may be performed by a compression system implemented according to the invention.
Figure 5:
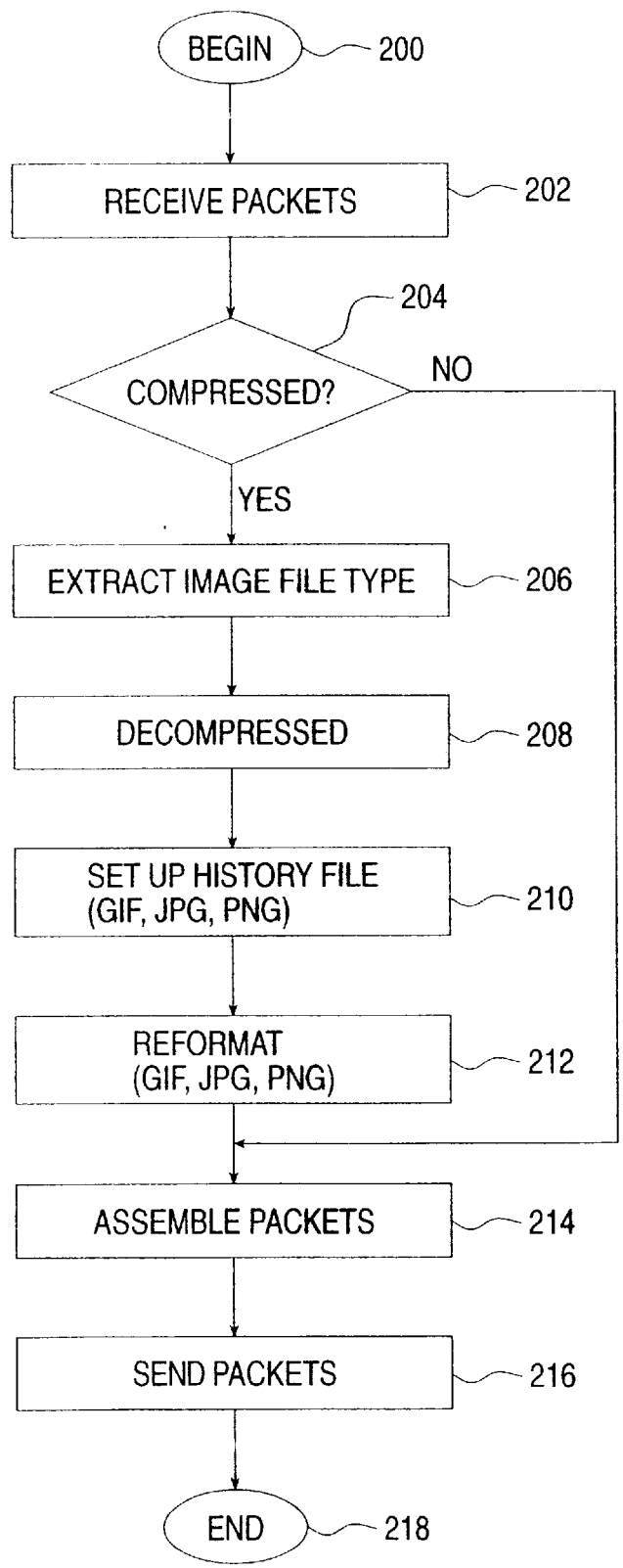
FIG. 5 is a flowchart of operations that may be performed by a decompression system implemented according to the invention.

With the above high-level description in mind, the details of one embodiment of the invention will be treated in conjunction with FIGS. 29–5. FIGS. 2 and 3 are block diagrams of compressor 20 and decompressor 22 sections, respectively, of a device that is installed in the network. FIGS. 4 and 5 are flowcharts that describe operations that may be performed by the compressor 20 and decompressor 22 sections depicted in FIG. 2 and 3, respectively, or by other embodiments of the invention.

In FIG. 2, a compressor 20 processes an inbound stream of packets. A network input interface 36 terminates the physical layer and provides layer 2 packets to a processor 38. When the devices (i.e., the image file compressor 20 and the image file decompressor 22) are installed between the routers as illustrated in FIG. 1, the network interfaces 36 and 40 connect to a wide area network ("WAN") as described above. In some embodiments, one or more of the devices may be installed farther up or down the link (i.e., on the other side of the router). In this case, the network interfaces 36 and/or 40 may connect to a local area network ("LAN"). The network interface in this type of system will include a LAN-type interface such as an Ethernet interface. The details of the operation and implementation of network interfaces are well known in the IP data networking art. Accordingly, these aspects of the disclosed embodiments will not be treated in more detail here.

The processor 38 illustrated in FIG. 2 includes several logical components. The operations of these components are described in conjunction with FIG. 4 beginning at block 100.

At block 102 the processor 38 receives a packet from the network interface 36. A packet disassembler 42 determines whether the packet data has been compressed using a data compression format such as GIF (e.g., GIF 87a or GIF89a), JPG or PNG (block 104). In addition to these formats, other formats including, for example, GIFLIB, JPG ISO maybe supported. If the packet is not compressed, the packet is routed directly to a packet assembler 46 so that the packet bypasses the re-compression process (block 116).

If the packet data has been compressed using one of the supported compression formats, a data type comparator 48 may be used to determine the data type (i.e., compression format). This may be accomplished, for example, by comparing a data signature of the packet with known signatures 29 (e.g., a GIF signature, etc.) stored in a data memory 50 (block 106). In practice, this step may be part of step 104 discussed above.

At block 108 history data files 54 that may be used during the decompression process are set up. These files may be stored in the data memory 50.

At block 110 an image data expander 52 decompresses the data using the appropriate decompression algorithm. For example, this may involve performing GIF decompression 53, JPG decompression 55, or PNG decompression 57.

At block 112 an image data compressor 56 (e.g., compressor 28, FIG. 1) compresses the packet using a better compression algorithm. That is, the packets are compressed using an algorithm that achieves a higher degree of compression than the original compression algorithm (e.g., GIF). Various packet compression algorithms may be used at this stage. For example, the image data compressor 56 may incorporate the preferred embodiment of the better compression algorithm described below.

At block 114 a compressed packet identifier 58 marks the compressed packet to indicate that it has been compressed using the better algorithm. In one embodiment, the system prefixes a one bit tag to each packet to indicate whether the packet is compressed. In addition, the packet may be marked to indicate the original compression format (e.g., GIF). This may be accomplished, for example, by setting a parameter in the header of the packet.

At block 116 the packet assembler 46 formats the packets (compressed or not) as necessary to send them over the hop. This may involve, for example, generating a new header with a new checksum for those packets that were re-compressed.

Finally, at block 118, the processor 38 sends the packets to the network output interface 40. The network output interface 40 processes the network layer (IP) packets and provides the appropriate physical and data link layers to interface to the network. The details of the operation and implementation of a network output interface are also well known in the IP data networking art. The process then ends at block 120.

Referring again to FIG. 1, packets from the image file compressor 20 are routed over the network to the image file decompressor 22 on the other end of the path. As shown in FIG. 3, a network input interface 60 terminates the physical and data link layers and provides network layer (IP) packets to a processor. The details of the operation and implementation of the network input interface 60 may be similar to those discussed above in conjunction with FIG. 2.

Referring to FIG. 5 beginning at block 200, the operations of the processor 62 will now be treated. Many of the components and operations depicted in FIGS. 3 and 5 are similar to those discussed above in conjunction with FIGS. 2 and 4. Consequently, some of these operations will only be treated briefly here.

At block 202 the processor 62 receives a packet from a network input interface 60. At block 204, a compressed packet identifier 66 determines whether the inbound packet is compressed. As discussed above, this may involve checking a one bit tag prefixed to the packet that indicates whether the packet is compressed. If the packet is not compressed, the packet is routed directly to a packet assembler 76 so that the packet bypasses the decompression and reformatting processes (block 214).

If, at block 204, the packet is compressed, the compressed packet identifier 66 determines the original data type (i.e., the original compression format such as GIF) of the packet data (block 206). This information may be passed to the image file decompressor 22, for example, via a parameter in the header of the packet as discussed above in conjunction with block 114. Compression type information 67 may then be saved in a data memory 68 for use by an image data reformatter 72, if necessary.

At block 208 an image data decompressor 70 (e.g., decompressor 32, FIG. 1) decompresses the data. The image data decompressor 70 uses a decompression algorithm that is compatible with the better compression algorithm used at block 112 in FIG. 4.

At block 210 history data files 74 that may be used during the compression process are set up. The history data files 74 are stored in the data memory 68.

At block 212 the image data reformatter 72 compresses the packet using the original compression algorithm associated with the packet. For example, this may involve performing GIF compression 73, JPG compression 75, or PNG compression 77.

At block 214, a packet assembler 76 formats the packets (compressed or not) as necessary so they may be routed back to the network. This may involve, for example, generating a new header with a new checksum for those packets that were compressed.

Finally, at block 216, the processor 62 sends the packets to a network output interface 64. The network output interface 64 processes the network layer (IP) packets and provides the appropriate physical and data link layers to interface to the network. The details of the operation and implementation of a network output interface are also well known in the IP data networking art. The process then ends at block 218.

Figure 6:
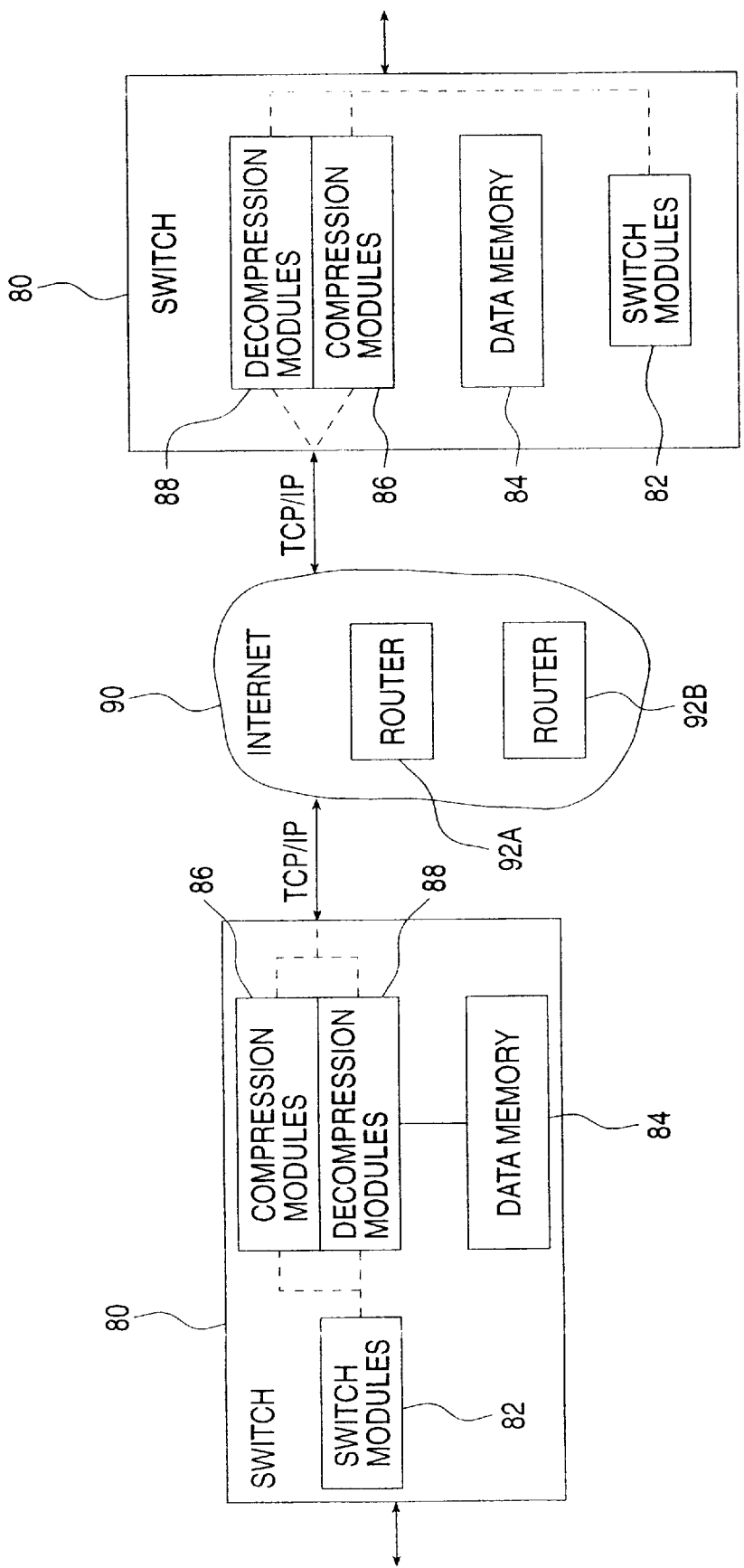
FIG. 6 is a block diagram of another embodiment of a data network incorporating compression and decompression in accordance with the invention.

FIG. 6 illustrates an embodiment of the invention that is integrated as a software module in devices 80 that are installed at each end of a predefined path in a network. The devices 80 may be routers, bridges, switches, modems or any other device in the network that handles packet traffic.

In general, the packet compression and decompression operations performed by the embodiment of FIG. 6 may be similar to those described above in conjunction with FIGS. 2–5. Compression and decompression software modules 86 and 88 are linked to software modules 82 in the devices 80 in a manner that enables the compression and decompression software modules 86 and 88 to intercept and process packets. A data memory 84 in each device 80 may be used to store the packet data.

Typically, the compression and decompression software modules 86 and 88 are implemented along the transmission path in the device where the packets are fully visible. For example, some of the packets flowing through the network may be encrypted. Thus, the compression and decompression software modules 86 and 88 may be linked to the device modules so that the compression and decompression software modules 86 and 88 have access to decrypted data.

In FIG. 6, compression and decompression modules 86 and 88 are installed on both sides of a duplex link. Accordingly, packet traffic flowing in either direction on the link may be compressed according to the invention.

FIG. 6 also illustrates that the invention may be used on more than a single IP hop. In FIG. 6, the packets are routed through a network 90 and, as a result, they may be routed over several hops. For example, a hop between the two routers 92A and 92B is shown. In this case, appropriate routing provisions should be made to ensure that all compressed packets are routed to the same receive module at the other end of the path. This may include, for example, defining static routes using IP tunneling.

In the network-based compression scheme above, it is important to maintain the reliability of the link. This is because in order to decompress packet "n," a decompressor must first decompress packets "1" through "n−1." Reliability may be provided by the reliability mechanism associated with TCP, HDLC (in its reliable mode) or PPP (in its reliable mode).

In addition, various initialization procedures may be performed. For example, all history files may be erased and various compression parameters may be exchanged between the compressor and the decompressor. These initialization procedures may be accomplished using a relatively simple three-way handshake such as the one used in TCP.

Figure 7:
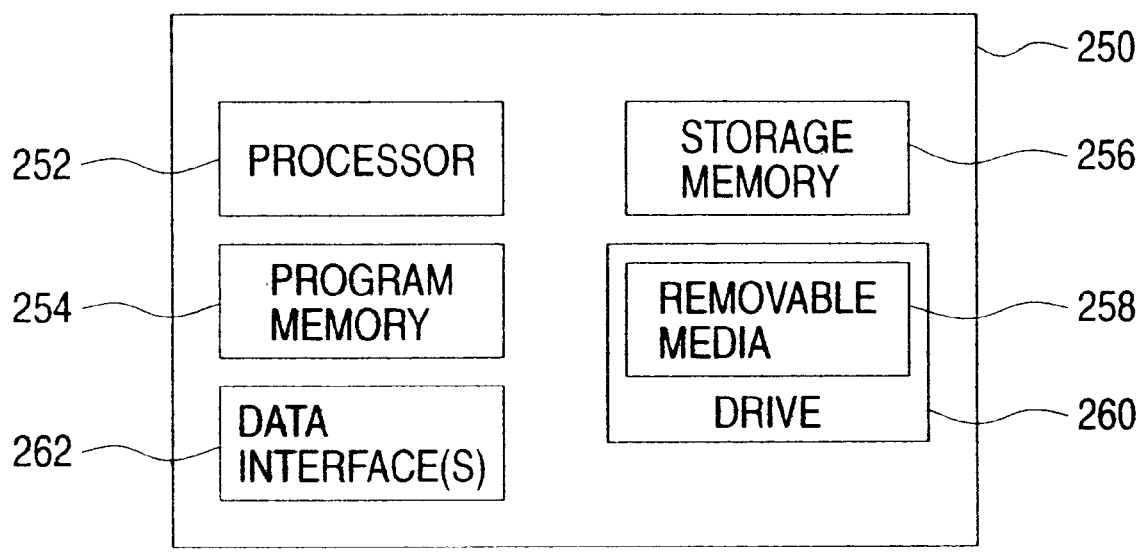
FIG. 7 is a block diagram of one embodiment of a device configured to perform compression and/or decompression methods according to the invention.

FIG. 7 illustrates some of the components that may be incorporated into a device 250 that performs data re-compression techniques in accordance with the invention. A processor 252 executes program code (not shown) stored in a program memory 254 to perform, for example, the methods described herein in conjunction with FIGS. 1–6 and 8–10. Typically, the program memory 254 comprises a read only memory (ROM) device or a semi-permanent data memory such as a flash memory. The computer 250 also includes at least one storage memory 256 for storing dynamic data. Typically, the storage memory 256 comprises a random access memory (RAM) device or a disk drive.

The program code may be pre-loaded into the program memory 254, for example, at the factory. Alternatively, in embodiments that are connected to a data network such as the Internet, the program may be downloaded from a server via the data network.

In another embodiment, the program code may be stored on a removable media 258 such as a CD-ROM or a floppy disk. In this case the computer 250 would include a removable media drive 260 such as CD-ROM drive or a floppy disk drive. The program code may then be downloaded into the program memory 254 or, in some cases, accessed directly by the processor 252 from the removable media 258.

One or more data interfaces 262 may enable the computer 250 to send or receive data to or from external devices (not shown). This data may include the program data, the original data, the compressed data or the decompressed data. Examples of data interfaces 262 include serial or parallel ports, bus interfaces, or data network interfaces.

The teachings of the invention may be used store data more efficiently in a data memory such as a system disk drive. Such a scheme may be used, for example, by a computer operating system and implemented in the embodiment of FIG. 7 in the following manner. The computer 250 includes an operating system installed in the program memory 254 and executed by the processor 252. The file management routines of the operating system incorporate the re-compression functions as treated herein. Thus, the operating system re-compresses files before they are saved to the system hard disk drive (e.g., storage memory 206) and reformats the files after they are read from the system hard disk drive.

Figure 8:
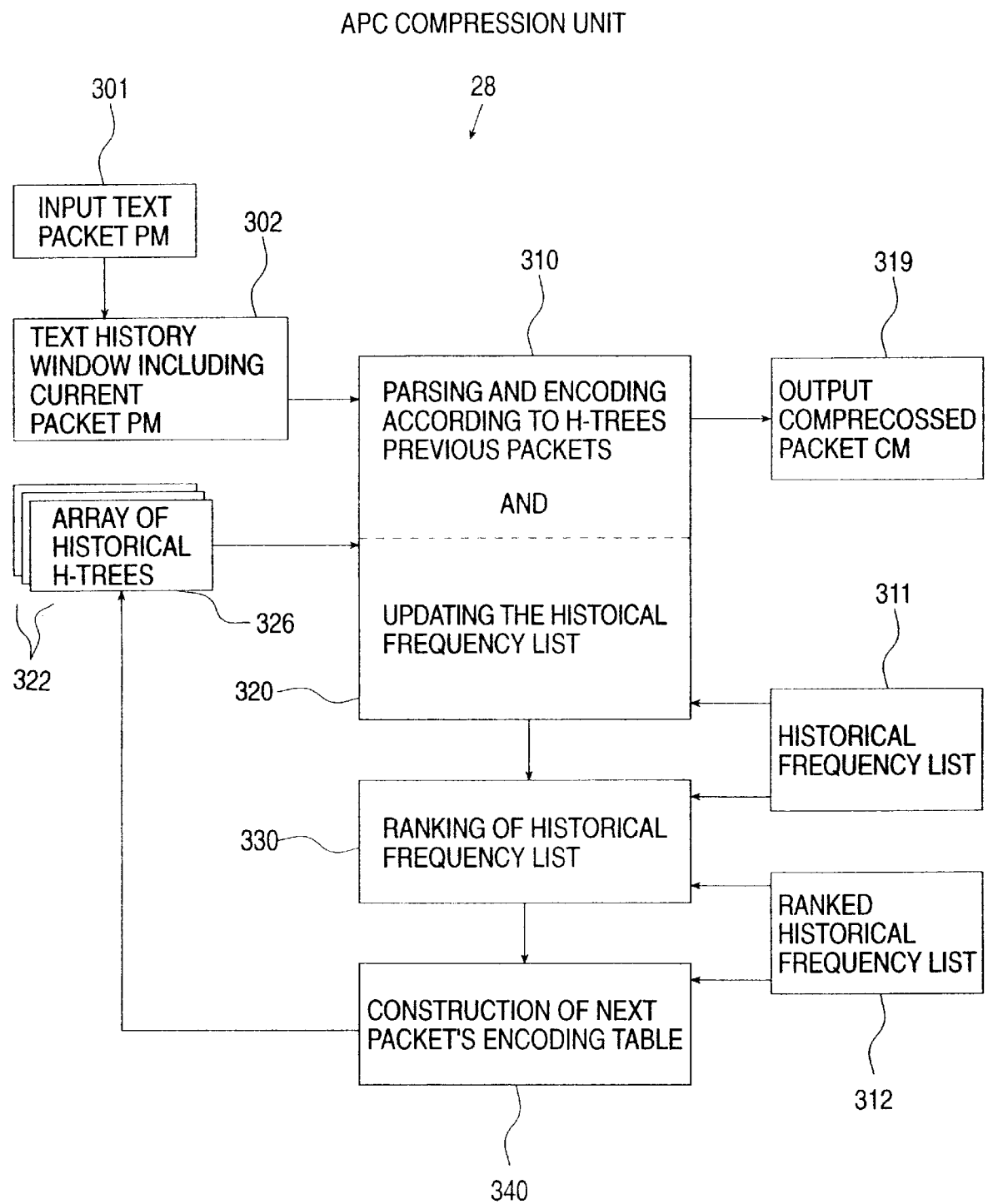
FIG. 8 is a schematic block diagram of a preferred compression unit according to the present invention.

Referring now to FIG. 8, a preferred algorithm for the providing improved compression will be discussed in detail. The compression method of the preferred embodiment is an Adaptive, Packet oriented Compression technique and is referred to herein as "the APC technique" or just "the APC". The APC technique belongs to the "lossless" class of data compression systems and methods, which fully preserve compressed data, though in a different format or representation. After "lossless" compression, the encoded data can be fully restored without loss of information. By contrast, "lossy" compression methods seek to achieve greater compression by the loss of a certain portion of the information. Thus, "lossless" compression methods are often more desirable, particularly for medical and legal documents.

According to the present invention, the text to be compressed may be received over a communication channel or otherwise presented in blocks or packets, each including an arbitrary number of data characters. Such a packet may be very small, only including tens to hundreds of characters. Preferably, each packet is compressed separately, without waiting for subsequent packets.

As each packet is compressed, a data dictionary is constructed according to the LZ77 algorithm. This data dictionary is composed of items, which can be in one of the following three forms.

The first form, and the most basic building block of the input text, is a "character", typically some 8-bit sequence such as ASCII or EBCDIC representations.

The second form is an "(Offset,Length) pair", in which a subsequent occurrence of a certain character sequence is replaced by a backward reference pointer to some earlier occurrence of that sequence in the text, indicating the location of the earlier occurrence (offset), and the number of characters to be copied (length).

For example, if the text is . . . xxxABCDxABCxx . . . , the second occurrence of ABC can be replaced by the pointer (5,3), indicating that once the string has been processed up to and including Dx, the subsequent characters can be reconstructed by going backwards 5 characters, and copying exactly 3 characters from the data.

The third form is a "Run Length Encoding" (RLE). A string of length n, for n>1, of repetitive identical characters can be replaced by a single occurrence of this character, preceded by the repetition factor n. For example, the seven consecutive "A's" in the text string xyzAAAAAAAxyz can be replaced by the designation "(7)A", where "(7)" is the repetition factor 7.

Once the encoding dictionary has been prepared, two Huffman trees (also referred to herein as H-trees) are constructed. The Huffman scheme is a method for constructing minimum redundancy code and is classically associated with a tree structure. However, the scheme could also be implemented by an array, a linked list, or a table for example. For the sake of clarity, the description herein focusses on Huffman trees, it being understood that this is for the purposes of discussion only and is not meant to be limiting in any way. The first H-tree will be subsequently referred to as Alpha and the second H-tree as Beta. These H-trees form the encoding table. The tree Alpha is constructed according to the occurrence frequencies of the parsed elements which have the form of a Character, the occurrence frequencies of the repetition factor from the parsed elements which have the form of RLE items, and the occurrence frequencies from the Length part of the parsed elements which have the form of (Offset,Length) pairs. Every RLE is therefore composed of a pair of dictionary items, both of which are encoded in tree Alpha. The tree Beta is constructed according to the occurrence frequency of the Offset part of the (Offset,Length) pairs.

The encoding phase is performed as follows. A Character is encoded according to tree Alpha. An (Offset, Length) pair is encoded in the following manner. First, the Length part is encoded according to tree Alpha, which also indicates that the next element to be encoded is the Offset part of the pair. The Offset part is then encoded according to tree Beta. For the RLE, both the repetition factor and the character are encoded according to tree Alpha.

For the first packet, a pair of H-trees, Alpha and Beta could be chosen which do not depend upon input data, but which are instead fixed in advance. For example, the pair could be based upon a uniform distribution, which assumes that all the elements appear with the same probability. As another example, the pair could be based upon a standard distribution of characters in English, obtainable from a reference such as "Information retrieval: Computational and theoretical aspects", by H. S. Heaps, Academic Press, New York (1978). A similar fixed H-tree pair must be used for decompression, as further described below.

As the elements forming the basis of the Huffman tree construction algorithm are known to the decoder while processing each packet, identical copies of both Huffman trees Alpha and Beta can be reconstructed at the receiving end without the transfer of the encoding tables. Furthermore, in contrast to the methods of Whiting (Whiting D. L, George G. A., Ivey G. E.: Data compression apparatus and method, U.S. Pat. No. 5,016,009, May 14, 1991; Whiting D. L., George G. A., Ivey G. E.: Data compression apparatus and method, U.S. Pat. No. 5,126,739, Jun. 30,1992), there is no need to attach extra superfluous bits to the encoded data in order to distinguish between single Characters and (Offset, Length) pairs, thereby increasing the amount of information compressed within a given number of bits.

The encoding table contains information from an H-tree pair. Rather than discarding the encoding table of the current packet after processing the current packet, a number of encoding tables from a certain number of previously processed packets may be retained. The number of retained tables may be predetermined or user adjustable. The collection of retained encoding tables is therefore referred to herein as a "History" encoding table. The number of previously processed packets is hereinafter designated as the "packet history depth". By contrast to prior art compression methods which encode each packet according to a dynamically changing encoding table, the current packet is encoded according to the History encoding table, so that the method of the present invention is semi-static. This provides for more efficient utilization of the information already gathered for previous packets, such as better encoding of the (Offset, Length) pairs and RLE elements, and hence for better compression. Furthermore, the elimination of the frequent updates necessary for the dynamically changing encoding table leads to significant savings in processing time.

Preferably, the History encoding table is only updated once per packet. A temporary encoding table is preferably constructed separately for the current packet. After the encoding phase is completed, the History encoding table is updated according to this temporary table, thereby significantly increasing the encoding table updating speed and hence the process speed. For additional improvement in processing speed, a partial sorting scheme is preferably employed while constructing the Huffman trees. Such a scheme sacrifices slight or practically negligible compression capacity in exchange for a significant increase of processing speed.

Data communication systems normally transmit data in units called blocks or packets, each consisting of a plurality of Characters. Data compression systems operating in communication environments need therefore compress each packet before transmission, and decompress the compressed packets at the receiving end. Moreover, the data compression system which imposes additional overhead on the system, need be as transparent as possible.

The compression method of this embodiment, ("APC"), is designed to accommodate communication systems, and as such it compresses data on a packet by packet basis. The packets can be of fixed or variable length. Each packet is compressed as it is presented to the compression system without the need to wait for subsequent packets.

The compression process is shown for a packet Pm, which is one of an a priori unbounded sequence of packets P1,, P2,,P3, . . . . For the purposes of illustration, packets P1. Pm−1 are assumed to have already been processed by APC compression unit 28.

The APC compression unit 28 maintains the following data structures. The first structure is a historical frequency list 211, a data dictionary which includes statistical information relating to the occurrence frequencies of the data items in some or all of the previously processed packets P1, . . . ,Pm−1.

The second structure is an array 222 of Alpha and Beta Huffman tree pairs, each pair including an encoding table constructed for some previously processed packets according to a procedure derived from Huffman's algorithm, as described in the "Brief Description of the Invention" previously.

The third structure is a text history window 202, which is a buffer of length w including the w most recent characters of the most recently processed packets, and at least the characters of the current packet Pm, i.e. w(length(Pm).

In the illustrated method, an input text packet Pm is first received by APC compression unit 28, as shown by block 201. Input text packet Pm is then placed in the text history window as shown by block 202.

Next, the parsing and encoding step is shown in sub-block 210, in which the data items of the current packet Pm are parsed using a scheme derived from the LZ77 method. The data items are parsed by constructing a data dictionary, as previously described in the "Brief Description of the Invention".

The parsing of data items is performed according to any variant of LZ77 such as Whiting's (Whiting D. L, George G. A., Ivey G. E.: Data compression apparatus and method, U.S. Pat. No. 5,016,009, May 14, 1991; Whiting D. L., George G. A., Ivey G. E.: Data compression apparatus and method, U.S. Pat. No. 5,126,739, Jun. 30,1992).

The variant of LZ77 may further employ a greedy approach (see for example Cormen T. H., Leiserson C. E., Rivest R. L., Introduction to Algorithms, The MIT Press, Cambridge, Mass. (1990), Chapter 17), in which the next data item is chosen at each position as the one parsing the longest possible string. Alternatively, a scheme referred to herein as lookahead may be employed, according to which various parsing alternatives are examined as data items are parsed, and those schemes which produce smaller encodings are used. As mentioned above, each parsed data item can take the form of a Character, an (Offset,Length) pair, and a RLE.

For instance, suppose the given text is xxxABCDEFG and has already been parsed up to, but not including, the string ABC. Suppose further that the string ABCDE, but not the string ABCDEF, has occurred earlier in the text that has already been parsed. Then one possibility, according to the preferred variant of the LZ77 algorithm, is to continue the parsing by an (Offset, Length) pair, where Offset is the distance in characters from the current position to the previous occurrence of ABCDE, and Length=5. Denote this Offset as d1. However, before deciding to encode the characters following the current position as an (Offset, Length) pair, the proposed algorithm disclosed herein checks some alternative, namely encoding the single Character immediately following the current position (A in the given example) on its own and starting the (Offset, Length) encoding only for the subsequent characters. There are now two possibilities.

In the first possibility, the two alternatives parse strings of the same length. If the string parsed after the single character is just the suffix of the earlier string (BCDE in the example, to be encoded by some Offset d2, and Length=4), then the number of bits necessary to encode the pair (d1,5) is compared to the number of bits necessary to encode the single character plus the number of bits necessary to encode the pair (d2,4). The alternative requiring the smaller number of bits is then chosen.

In the second possibility, the two alternatives parse strings of different lengths, which may happen if, for example, the string BCDEFG did appear earlier, say, at some offset d3, even though the string ABCDE did not. The comparison of the number of bits necessary for the two encodings as above would not be accurate, since they do not replace the same number of text characters. Rather, the relative costs per character are compared as follows. Let n1, n2 and n3 denote, respectively, the number of bits necessary to encode the pair in the first alternative ((d1,5) in the example), a single character (A in the example) and the pair in the second alternative ((d3,6) in the example). Let m1 and m2 denote the number of characters parsed in the two alternatives (m1=5 and m2=7 in the example). Then the value of n1/m1, the number of bits necessary per character for the first alternative, is compared with (n2+n3)/m2, the corresponding number for the second alternative. The alternative corresponding to the smaller number is then chosen.

Many different alternative schemes with several parsed data items of any type could potentially be examined, depending on the specific implementation and the computer resources available. For example, additional alternatives could be included, such as encoding the next two, three or more characters first, and only then trying to parse the tail by an (Offset, Length) pair. As another example, two or more adjacent (Offset, Length) pairs could be differently parsed.

Once the data have been parsed, they are then encoded according to a selected H-tree pair of the array of Alpha and Beta H-trees. As described previously in the "Brief Description of the Invention", the tree Alpha is constructed according to the occurrence frequencies of the parsed elements which have the form of a Character, the occurrence frequencies of the repetition factor from the parsed elements which have the form of RLE items, and the occurrence frequencies from the Length part of the parsed elements which have the form of (Offset,Length) pairs. Every RLE is therefore composed of a pair of dictionary items, both of which are encoded in tree Alpha. The tree Beta is constructed according to the occurrence frequency of the Offset part of the (Offset,Length) pairs.

The encoding phase is performed by encoding the parsed data according to a selected H-tree pair from the H-tree array. To further optimize the compression, the current packet Pm is preferably further logically divided into segments, each segment comprising one or more parsed data items. The parsed elements of each segment are encoded according to the current H-tree pair of the array of H-tree pairs, but simultaneously, alternative encodings according to one or more other H-tree pairs of the array are probed. At the end of each segment, the costs of the segment encoding according to each of the H-tree pairs are compared. The pair yielding the lowest cost is chosen, and a short designation indicator (e.g., the index of the chosen H-tree pair in the array) is adjoined in front of the actual encoding of the data items in the segment.

For a given H-tree pair, the parsed data is encoded as follows. Each Character is encoded according to tree Alpha. An (Offset,Length) pair is encoded in the following manner. First, the Length part is encoded according to tree Alpha, which also indicates that the next element to be encoded is the Offset part of the pair. The Offset part is then encoded according to tree Beta. For the run-length encoding, both the repetition factor and the character to be repeated are encoded according to tree Alpha. The generated encoding is placed in an output buffer denoted as the output compressed packet Cm, as shown in block 219.

The array of H-trees which has been constructed for previously processed packets, remains static and unchanged during the entire encoding phase of the current packet Pm. This constitutes the semi-static characteristic of the APC method of the present invention, an important consequence of which is enabling decompression of the current compressed packet without the transfer of the encoding table with the compressed packet.

In the next step, the historical frequency list is updated, as depicted by sub-block 220, using the frequencies of data items in the current packet Pm, in preparation for processing of the subsequent packet Pm+1. The historical frequency list is shown in block 311 and is a data dictionary which includes statistical information relating to the occurrence frequencies of the data items in at least one, but preferably substantially all, of the previously processed packets P1, . . . ,Pm−1. Preferably, instead of merely maintaining the occurrence frequencies of the data items in the historical frequency list, a weighting function can be used to reflect various factors relating to the data items including, but not limited to, statistical information relating to their occurrence frequencies, the distance of the packet numbers in which they recently occurred, and so forth.

An example for such a suitable weighting function follows: define freq(i,x) as the frequency of item x in the packet Pi, where i (m, and x is, for tree Alpha, either a character, a RLE or the Length part of an (Offset, Length) pair, and for tree Beta, the Offset part of an (Offset, Length) pair.

One could then define an predetermined integer constant k to be the packet history depth considered, and w(x) to be the weight of item x. The weight is then determined as follows. If m>k then the weight of item x for the current packet Pm is:

in packets Pm, whose index is larger than some previously set threshold k which reflects the packet history depth as $$w(x)(freq(m,x)+½freq(m-1, x)+¼freq(m-2, x)+ \ldots +(½)k freq(m-k, x)$$

However, if m (k then in packets Pm, whose index is larger than some previously set threshold k which reflects the packet history depth as $$w(x)(freq(m,x)+½freq(m-1, x)+¼freq(m-2, x) + \ldots +(½)m-1freq(1, x)$$

In other words, although the frequency of item x in the current packet Pm is taken without change, the frequencies in previous packets are multiplied by powers of ½, up to the k-th packet preceding the current one, if there are at least k preceding packets; otherwise, if there are less than k packets preceding the current one, this procedure is applied to all the preceding packets. Thus, as the occurrence of an item x is more distant in history, the impact on the weight is reduced.

Preferably, substantially all of the required tables freq(j, x), for m−k (j ( m are used for the determination of the weight. Alternatively and preferably, for greater ease of implementation, the following approximation could be substituted. After the parsing phase of the first packet P1, the function is set such that $$w(x) (freq(1,x)$$

For each of the subsequent packets Pi, the weight is updated after the parsing phase by $$w(x) (freq(i,x)+½w(x)$$

thereby requiring only a single frequency table. The historical depth value k governing the number of previous packets considered for the function is implicitly given in this case by the bit precision of the actual computer used in the implementation.

Once the historical frequency list has been updated, the historical frequency list is ranked, as depicted by block 330. In this step, the items in the list are ranked or arranged according to a selected arranging scheme, preferably using a partial sort scheme as discussed below. The resulting output of this phase is a ranked historical frequency list shown in block 312.

According to Huffman (Huffman D.: A method for the construction of minimum redundancy codes, Proceedings IRE, Vol 40, (1952) pp. 1098–1101), the construction of the Huffman tree requires the list of the occurrence frequency data items to be a sorted list. The data items having higher occurrence frequencies are then assigned shorter codewords. The sorting process for n items, whose computational complexity is of the order n*log(n), normally consumes a considerable amount of processing time.

An underlying assumption of the APC method and system of the present invention is that since data items with a lower frequency of occurrence are assigned longer encoding anyway, but have a reduced impact on the overall compression of the data, the compression gain obtained by having these low-frequency items properly sorted is relatively smaller. Thus, for increased efficiency, preferably the ranked historical frequency list is only partially sorted, so that the number of sort iterations is limited, thereby significantly increasing the processing speed in exchange for slight or negligible compression loss.

Preferably, a sorting technique is chosen such that by performing a relatively small number b of iterations, the data items having the highest occurrence frequencies will be placed closer to the top of the list, i.e., will be ranked higher. An example of a suitable sorting technique is SHELLSORT (Shell D. L., A high-speed sorting procedure, Communications of the ACM, Vol 2, (1959) pp. 30–32).

In accordance with a preferred embodiment of the present invention, the number b of sort iterations can be passed as a parameter to the APC compression unit 28 and adjusted according to the characteristics of specific data types. In particular, b=0 might indicate no sorting at all, and b=(might indicate a request for a complete sort.

Lastly, the step of coding table construction is performed as depicted by block 340, in which a pair of Alpha and Beta H-trees is constructed, according to the ranked historical frequency list and is ready for the processing of the subsequent packet Pm+1, if any. The pair is then placed in array 322 as pair 326.

Figure 9:
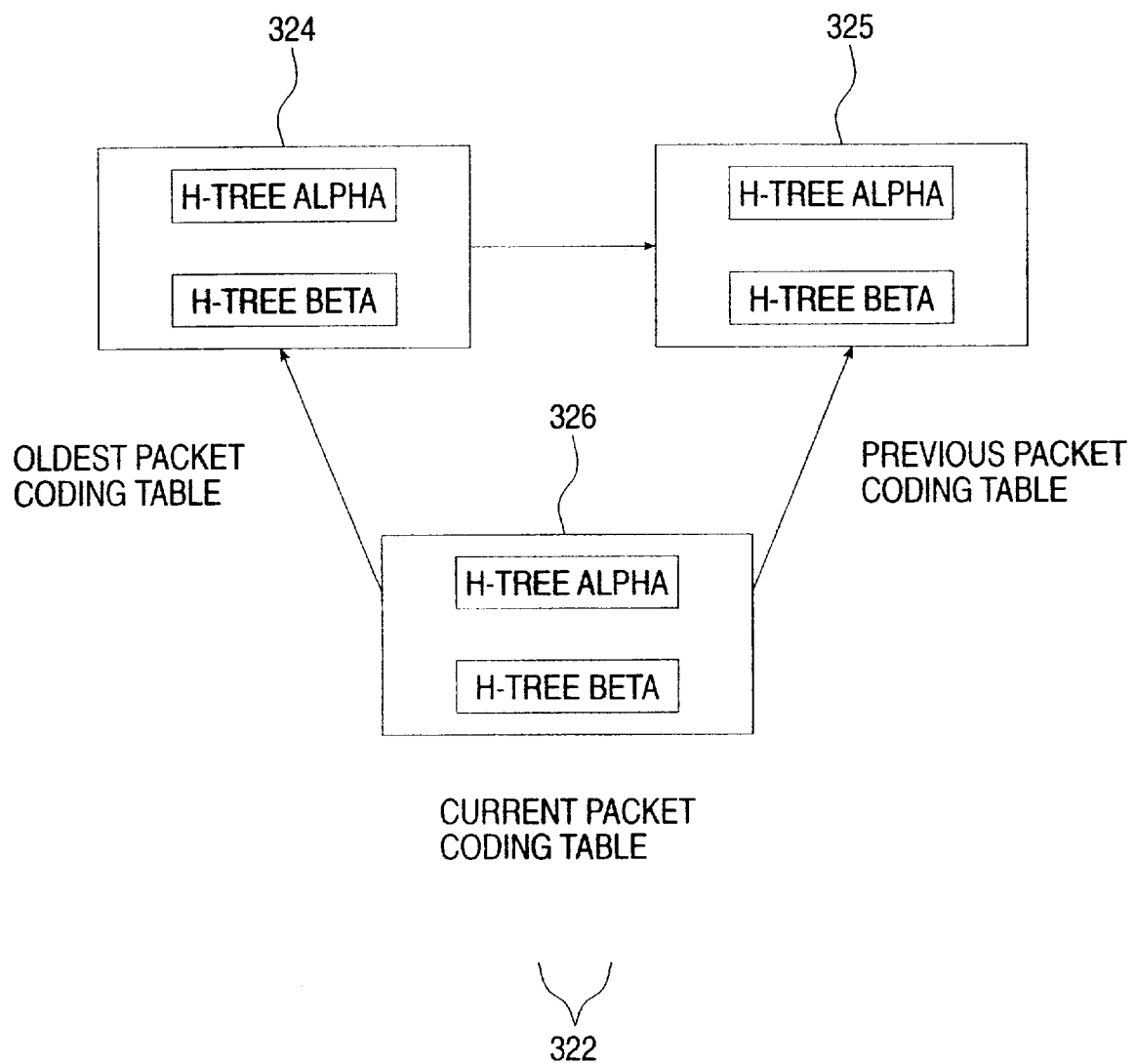
FIG. 9 is an illustrative H-Tree array according to the present invention.

FIG. 9 illustrates an exemplary array of Alpha and Beta H-tree pairs in more detail, constructed and operative according to a preferred embodiment of the present invention. Three array elements 324, 325 and 326 are illustrated, it being understood that the number of array elements shown is not intended to be limiting. Each array element is an Alpha and Beta H-tree pair, which reflects the encoding table constructed for a previously processed packet, or for some preselected fixed distribution which does not necessarily relate to the given text. The number t of such historical H-tree pairs can range from one to some arbitrarily large number as can be accommodated by available computer resources. For FIG. 9, t=3.

In accordance with a preferred embodiment of the present invention, this number t can be passed as a parameter to the APC compression unit 28 and adjusted according to specific implementation constraints. Preferably, array 322 of H-tree pairs can be implemented, for efficiency reasons, as a cyclic linked list of H-tree pairs. In such a list, each element such as pair 324 points to a more recent element such as 325, and the list pointer points to the current or most recent H-tree pair element 326. In turn, pair element 326 points to the 'oldest' pair element 324. As newer elements are added, the list pointer is adjusted to point to the most recently added element, which becomes the current element.

Figure 10:
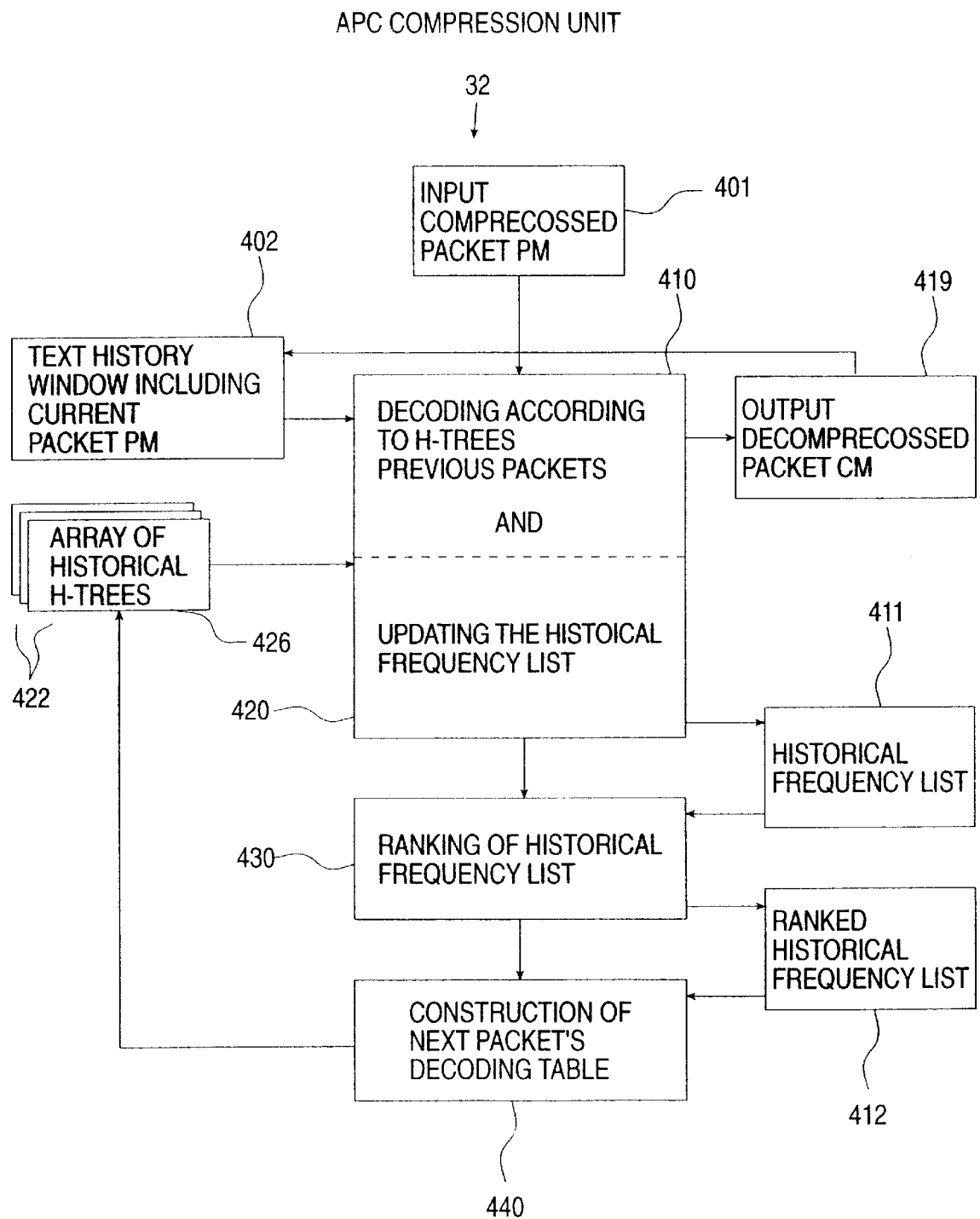
FIG. 10 is a schematic block diagram of a preferred decompression unit according to the present invention.

Reference is now made to FIG. 10 which depicts a block diagram of the method employed by APC decompression unit 32 of FIG. 1, illustrative of the decompression process as performed for the received compressed packet Cm of FIG. 8. This method is an obvious reversal of the compression process. To start the decompression process, the same fixed pair of Alpha and Beta H-trees should be used as for the compression process. A brief description of these H-trees as used for compression is described above.

In the illustrated method, a compressed packet Cm is first received by APC decompression unit 32, as shown by block 401. Next, the input compressed packet Cm is decoded according to the array of H-tree pairs from previously decompressed packets, as shown in sub-block 410. Decoding is performed with the specific H-tree pair designated by the H-tree index bits appended to each segment within the received encoded data.

The generated decoded data items are then converted according to a scheme derived from the LZ77 technique, into a sequence of characters which are placed in an output buffer denoted as the output decompressed packet Pm, as shown in block 419. The output data is then placed in a text history window as shown by block 402. Similarly to FIG. 8, the text history window is a buffer of length w including the w most recent characters of the most recently processed packets, and at least the decoded characters from the current output decompressed packet Pm, such that w (length(Pm)).

After the data has been decoded, the historical frequency list of block 411 is updated, as shown in block 430. The historical frequency list is a data dictionary which includes statistical information relating to the occurrence frequencies of the data items in some or all of the previously decompressed packets C1, . . . , Cm−1.

The decoding tables are the array of H-trees shown in block 422, and are constructed in a manner which is substantially identical or functionally equivalent to that employed by the compression process of FIG. 8 for constructing the array of H-trees shown in block 222. The decoding tables are constructed in preparation for the decoding of the subsequent compressed packet Cm+1. Identical or equivalent weighting functions and ranking methods are employed as described for FIG. 8, thereby effectively mirroring the construction process of the compression unit 28 encoding tables. This eliminates the need for transfer of the encoding tables along with the encoded data. The tables remain static and unchanged during the entire decoding step 410 of each current packet Cm.

Although a few embodiments have been illustrated, modifications to these embodiments could be made without departing from the spirit of the present invention. For example, in the embodiment depicted by FIG. 8, one could first construct the coding table entry 226 and only thereafter perform the parsing and encoding step 210, thereby constructing the coding table only if a packet has been received.

Another example of a possible modification can be given for the ranking step as depicted by block 230 of FIG. 8, where rather than arranging or partially sorting the historical frequency list, a selected number of the items on the list can be provided in the desired order to the encoding table generation step depicted by block 240.

From the above, it may be seen that the invention provides an improved method of increasing data throughput in a network. While certain specific embodiments of the invention are disclosed as typical, the invention is not limited to these particular forms, but rather is applicable broadly to all such variations as fall within the scope of the appended claims. To those skilled in the art to which the invention pertains many modifications and adaptations will occur.

For example, the devices may be installed at various locations within the network. The invention may be implemented using a variety of hardware and software architectures. The teachings of the invention are applicable to numerous protocols in addition to those described above. A number of compression/decompression algorithms and compression/decompression history techniques may be used to compress or decompress data. Other compression/ decompression techniques may be used to provide improved compression/decompression. The invention is not limited to the compression/decompression of image data. The system may compress and decompress various types of flows of various types of data. Also, other forms of flow identifiers may be used. Thus, the specific structures and methods discussed in detail above are merely illustrative of a few specific embodiments of the invention.

What is claimed is:

1. A method of re-compressing compressed data that was previously compressed using a first compression algorithm, the method comprising the steps of:

providing a second compression algorithm that provides better compression than the first compression algorithm;

identifying compressed data that was compressed using the first compression algorithm;

decompressing the identified compressed data using an algorithm compatible with the first algorithm; and compressing the decompressed data using the second compression algorithm.

2. The method of claim 1 wherein the first compression algorithm comprises a type of GIF compression.

3. The method of claim 1 wherein the first compression algorithm comprises a type of JPG compression.

4. The method of claim 1 wherein the first compression algorithm comprises a type of PNG compression.

5. The method of claim 1 wherein the identifying step comprises analyzing a data signature of the data that was previously compressed using the first compression algorithm.

6. The method of claim 1 further comprising the steps:

defining an identifier that identifies the compressed decompressed data as being compressed with the second algorithm; and associating the identifier with the compressed decompressed data.

7. The method of claim 1 further comprising the steps of:

defining an identifier that identifies the first compression algorithm; and associating the identifier with the compressed decompressed data.

8. A method of decompressing compressed data that was compressed using a second compression algorithm that provides better compression than a first compression algorithm, wherein the compressed data was previously compressed using the first compression algorithm, the method comprising the steps of:

providing a decompression algorithm that decompresses data that was compressed using the second compression algorithm;

identifying data that was compressed using the second algorithm;

decompressing the identified data using the decompression algorithm; and compressing the decompressed data using an algorithm compatible with the first compression algorithm.

9. The method of claim 8 wherein the decompression algorithm comprises a type of GIF decompression.

10. The method of claim 8 wherein the decompression algorithm comprises a type of JPG decompression.

11. The method of claim 1 wherein the decompression algorithm comprises a type of PNG decompression.

12. The method of claim 1 wherein the identifying step comprises analyzing an identifier associated with the data that was compressed using the second algorithm.

13. An apparatus for re-compressing compressed data that was previously compressed using a first compression algorithm, the apparatus comprising:

a data type identifier for identifying compressed data that was compressed using the first compression algorithm;

a data decompressor for decompressing the identified compressed data using an algorithm compatible with the first algorithm; and a data compressor for compressing the decompressed data using a second compression algorithm that provides better compression than the first compression algorithm.

14. The apparatus of claim 13 further comprising at least one network interface.

15. An apparatus for decompressing compressed data that was compressed using a second compression algorithm that provides better compression than a first compression algorithm, wherein the compressed data was previously compressed using the first compression algorithm, the apparatus comprising:

a data type identifier for identifying data that was compressed using the second algorithm;

a data decompressor for decompressing the identified data using a decompression algorithm that decompresses data that was compressed using the second compression algorithm; and a data compressor for compressing the decompressed data using an algorithm compatible with the first compression algorithm.

16. The apparatus of claim 15 further comprising at least one network interface.

17. A computer program product comprising:

a computer usable medium having computer readable program code means embodied therein for re-compressing compressed data that was previously compressed using a first compression algorithm, the computer readable program code means in said computer program comprising:

means for identifying compressed data that was compressed using the first compression algorithm;

means for decompressing the identified compressed data using an algorithm compatible with the first algorithm; and mean for compressing the decompressed data using a second compression algorithm that provides better compression than the first compression algorithm.

18. A memory for storing data, said memory having a data structure stored therein, said data structure including the stored data and comprising:

means for identifying compressed data that was compressed using a first compression algorithm;

means for decompressing the identified compressed data using an algorithm compatible with the first algorithm; and mean for compressing the decompressed data using a second compression algorithm that provides better compression than the first compression algorithm.

* * * * *